United States Patent
Ackerman et al.

(10) Patent No.: US 6,291,813 B1
(45) Date of Patent: Sep. 18, 2001

(54) METHOD AND SYSTEM FOR DERIVING A CONTROL SIGNAL FOR A FREQUENCY STABILIZED OPTICAL SOURCE

(75) Inventors: David A. Ackerman, Hopewell, NJ (US); Scott L. Broutin, Kutztown, PA (US); James K. Plourde, Allentown, PA (US); John W. Stayt, Jr., Schnecksville, PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/327,259

(22) Filed: Jun. 7, 1999

(51) Int. Cl.[7] ........................................................ H01S 3/13
(52) U.S. Cl. ............................ 250/214 R; 372/28; 372/32
(58) Field of Search ........................... 250/214 C, 214 R, 250/226, 552; 359/246, 247, 248, 249, 260; 372/9, 20, 23, 28, 29, 32, 33, 34, 38

(56) References Cited

U.S. PATENT DOCUMENTS

| 5,107,512 | * | 4/1992 | Shibutani | 372/32 |
| 5,251,275 | | 10/1993 | Kuriyama et al. | 385/14 |
| 5,666,225 | | 9/1997 | Colbourne | 359/589 |
| 5,691,989 | | 11/1997 | Rakuljic et al. | 372/20 |
| 5,706,301 | * | 1/1998 | Lagerström | 372/32 |
| 5,798,859 | | 8/1998 | Colbourne et al. | 359/247 |
| 5,825,792 | * | 10/1998 | Villeneuve et al. | 372/32 |
| 6,122,301 | * | 9/2000 | Tei et al. | 372/32 |

OTHER PUBLICATIONS

*E2500–Type 2.5 Gbits/s Electroabsorption Modulated Isolated Laser Module (EM–ILM) for Ultralong–Reach Applications (>600 km)*, Lucent Technologies Inc., Sep. 1998, pp. 1–12.

* cited by examiner

Primary Examiner—John R. Lee
(74) Attorney, Agent, or Firm—Synnestvedt & Lechner LLP

(57) ABSTRACT

A method is disclosed for frequency stabilization of an optical source, using data obtained from a frequency stabilization system based on an optical frequency discriminator to stabilize the output of a laser to a particular grid channel. The data is mathematically manipulated to double the number of channels as compared to prior art methods and allows arbitrary channel spacing about the channels.

21 Claims, 7 Drawing Sheets

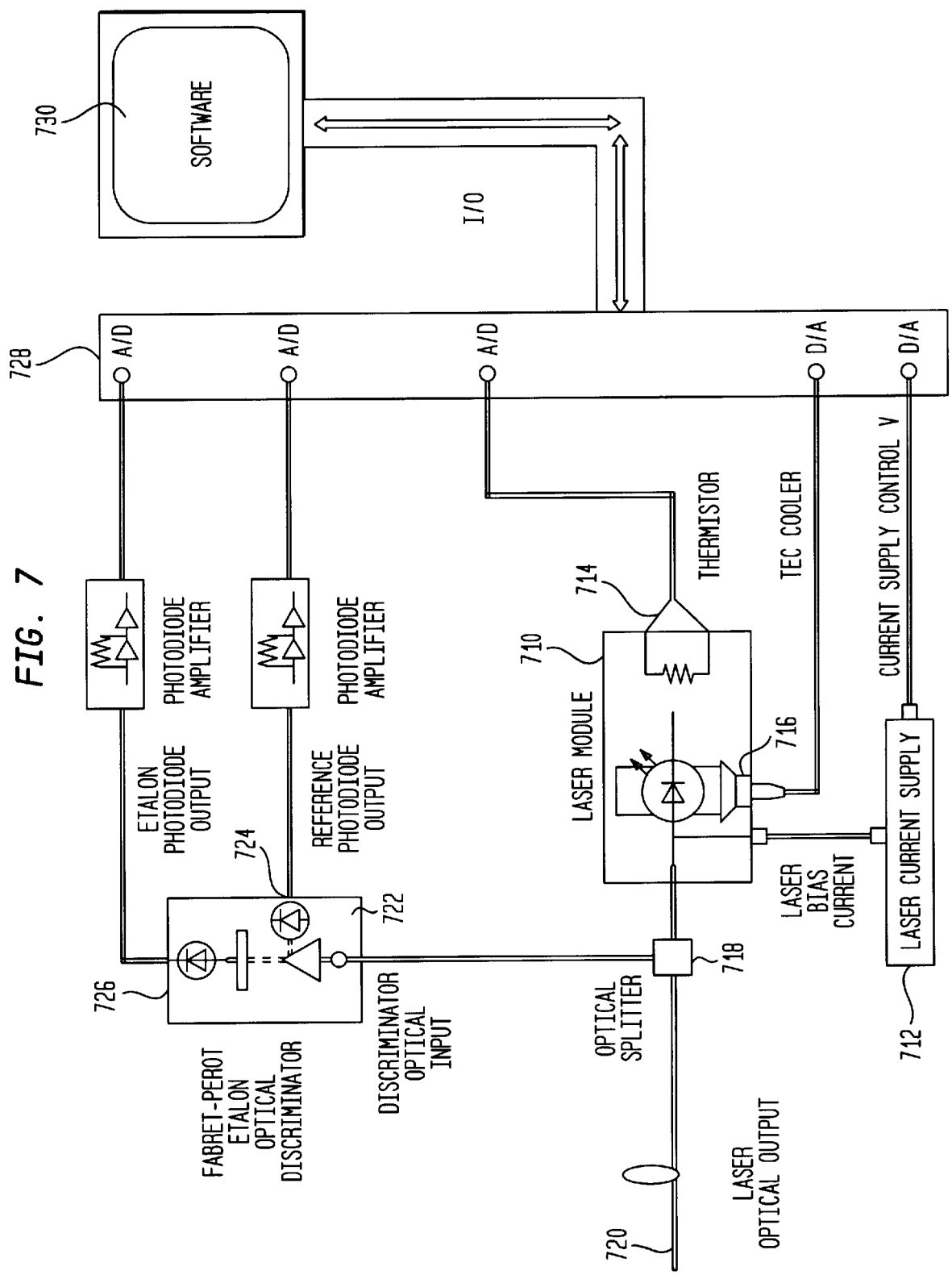

METHOD AND SYSTEM FOR DERIVING A CONTROL SIGNAL FOR A FREQUENCY STABILIZED OPTICAL SOURCE

FIELD OF THE INVENTION

This invention relates to a method for frequency stabilization of an optical source and, more particularly, to an approach for using data obtained from a frequency stabilization system based on an optical frequency discriminator to stabilize the output of a laser on a particular desired grid channel. This invention mathematically manipulates the data to double the number of channels as compared to prior art methods and allows arbitrary channel spacing about the channels.

BACKGROUND OF THE INVENTION

Accurate wavelength lasers are needed as transmitter sources for Wavelength Division Multiplexed (WDM), Dense Wavelength Division Multiplexed (DWDM) fiber-optic communications, pump lasers for various media such as Erbium doped optical fiber amplifiers (EDFA) or solid state lasers, illumination sources for differential spectroscopy, and other applications requiring compact, precise wavelength sources. In telecommunications, semiconductor lasers have been used because of their small size, low cost, high efficiency, and ability to be modulated at high speed. These sources typically operate in the 1.3 $\mu$m band, which is at the zero dispersion point of conventional optical fibers, and more recently in the 1.55 $\mu$m band because of the loss minima and the availability of EDFA's in this wavelength band.

Dense wavelength division multiplexed optical networks increase the information carrying capacity of a transmission system by loading multiple channels of differing optical frequencies onto a single optical fiber. The channel density of commercial DWDM systems has increased dramatically resulting in narrower frequency spacing between channels. This close channel spacing can be sensitive to crosstalk caused by frequency drifts in which a channel interferes with an adjacent channel. These drifts may be caused by phenomena similar to those occurring due to short-term drift and long-term aging.

While narrow frequency spacing between channels is desirable, prior art methods of achieving narrowed frequency spacing require that the thickness of an etalon optical filter be increased. This is related to the physics of a Fabry-Perot (FP) cavity. For example, in order to achieve 50 GHz spacing between channels using prior art methods, a 2-mm thick etalon is required; however, due to design constraints within a laser module, a 1-mm thick etalon is desired. Using prior art techniques, the minimum achievable spacing between channels using a 1-mm thick etalon is 100 GHz.

The free spectral range (FSR) of the FP etalon is determined by measuring the distance in optical frequency between a pair of adjacent peaks in the transmission spectrum. The transmission occurs at frequencies spaced c/2d apart, where c is the velocity of light and d is the distance between the reflective surfaces of the etalon. The output of a laser has a wavelength, and the point at which that wavelength and the transmission peak of the etalon cross a reference point is normally called a grid channel. In prior art systems this grid is defined at the peaks of the etalon function. The grid of channels is presently defined by the International Telecommunications Union (ITU) at 100 GHz channel spacing with 50 and 25 GHz spacing possible in the near future. Channel spacing will decrease in the future to allow more wavelengths to fit within the fixed bandwidth of the EDFA. Laser temperature determines which grid channel region a laser wavelength will be in at any given point in time.

Systems for stabilizing optical frequencies are employed within DWDM optical networks. Typically, these systems detect an optical frequency using a frequency discriminator in closed loop feedback with an optical source. Optical frequency information is translated into an error signal that is used to correct the source frequency to within some system-specific tolerance. It is well known that a FP etalon exhibits periodic optical transmission characteristics. It is also known that frequency discriminators with characteristics which are precisely aligned to the channel frequency of a DWDM system can be used to advantage, such as for frequency filtering, within such systems. Finally, it is known that FP etalons, used as discriminators, can be employed within DWDM systems when the FSR of the etalon is equal to the channel separation and the transmission peaks of the etalon are aligned with channel frequencies of the system. In prior art systems the laser channels will fall at intervals which are equal to the period of the etalon filter if the FSR, etalon angle to the laser source, and etalon temperature are properly matched to the absolute channel grid.

In addition to stabilizing an optical frequency on a particular grid channel, it may also be desired to switch from one grid channel to a different grid channel. Prior art systems allow changing between channels by simply temperature tuning the laser diode. The problem with these methods is that the laser has a temperature dependence of approximately +0.09 nm/° C. Precise 100 GHz wavelength control based strictly on temperature tuning is acceptable for the best of lasers, such as the type E2500 Electroabsorption Modulated Isolated Laser Module (EM-ILM) produced by Lucent Technologies, Inc., but is expected to be insufficient for a 25–50 GHz spaced system over an expected 25 year system life because of the small margin for drift in the lasers and filters used in these narrowly spaced systems.

SUMMARY OF THE INVENTION

A novel approach to frequency stabilization of a laser is presented. A flexible software method is applied to a pair of detected optical signals, one of which passes through an etalon and the other a reference signal directly from the laser output. In particular, the present invention comprises means for using a Fabry-Perot (FP) etalon for stabilizing an equally spaced comb of frequencies with a frequency separation of half the free spectral range (FSR) of the etalon, and for stabilizing frequencies that are not precisely spaced by either the full FSR or half the FSR. This method also allows arbitrary channel spacing, about these half frequency points, accessible through a software user interface. The detected optical signals are measured and then an algorithm is applied to the normalized difference in amplitude between the two signals. The difference will alternate in polarity as the wavelength of the laser (temperature) is swept. The signal difference is then used as a control signal to drive a thermoelectric cooler (TEC) to vary the temperature of the laser and thus vary (and allow tuning of) the laser output wavelength. By sensing what slope the wavelength of the laser falls upon at startup, a determination can be made as to which direction to move the laser wavelength to reach the desired channel. If needed to move the laser to a different channel, the difference calculation is inverted (by reversing the sign) to lock the laser channels at intervals which will be equal to half the period of the filter. This approach to laser wavelength selection and stabilization provides a stable and accurate laser output. The exact channel position may be defined at the peaks of the etalon function, or at an arbitrary position by adjusting the level where the reference signal crosses the etalon signal. The reference level may be electrically adjusted or adjusted by adding a software gain and offset value to the measured reference signal. Similarly, the etalon value may be electrically adjusted or adjusted by adding a software gain and offset value to the measured etalon signal. This allows for user adjustable wavelength spacing.

BRIEF DESCRIPTION OF THE DRAWINGS

FIG. 7 illustrates a basic structure for implementing the present invention.

DETAILED DESCRIPTION OF THE PREFERRED EMBODIMENT

Figure 1:
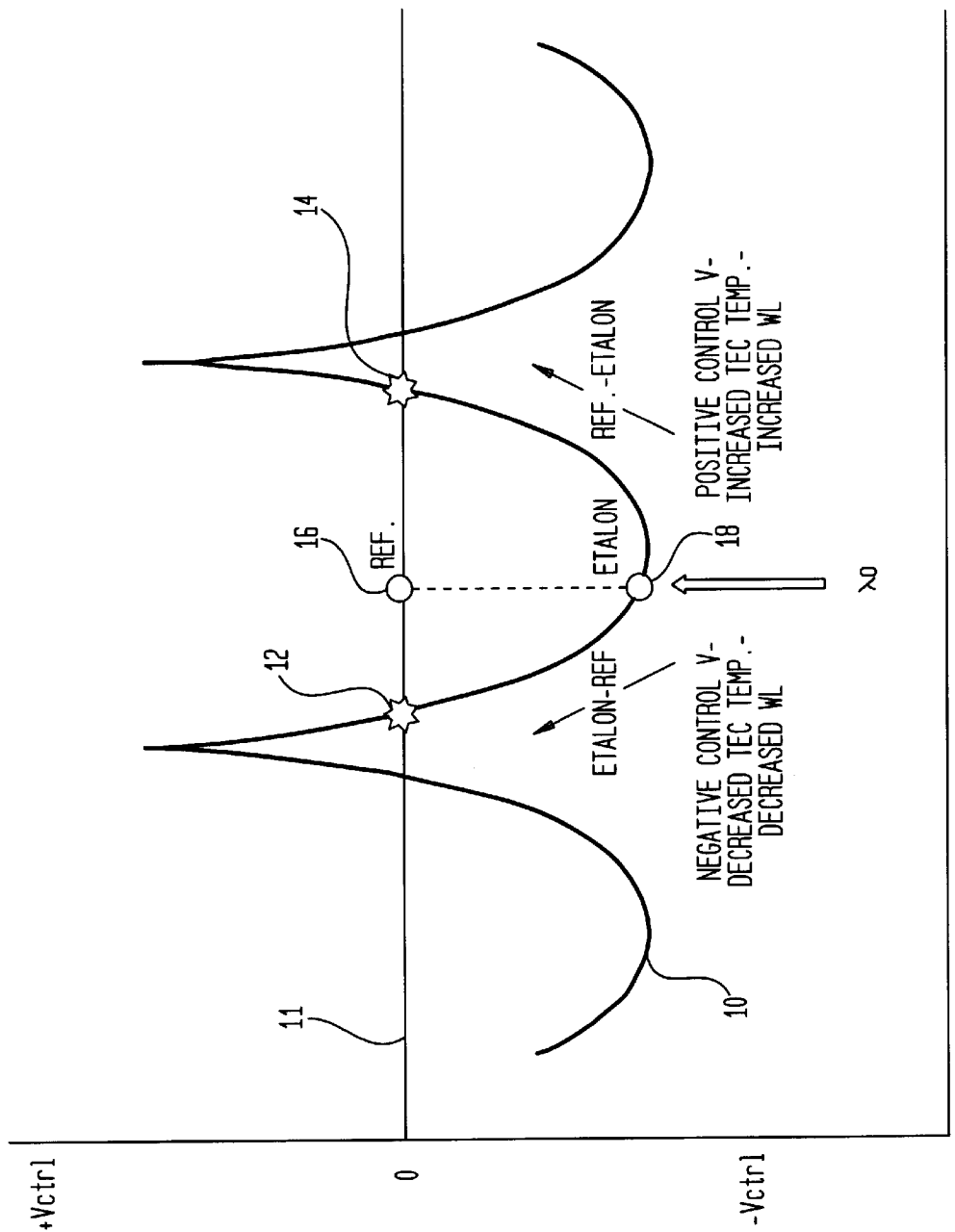
FIG. 1 is a graph of the typical output of a Fabry-Perot filter.

FIG. 1 is a graph of a typical output of a Fabry-Perot (FP) etalon filter. As shown in FIG. 1, a Fabry-Perot etalon optical filter has the characteristic of being infinitely periodic in nature as a function of the wavelength of the optical signal passed through it, and it transmits a signal 10 represented by a high finesse Lorentzian function, according to Airy's formulae, as the wavelength of the optical signal passing through it increases or decreases. In accordance with the present invention, an etalon output signal 10 and a constant reference signal 11 are detected and represented as shown in FIG. 1. Signals 10 and 11 are received from photodetectors capable of receiving the wavelength band of interest. One of ordinary skill recognizes that the specific configuration of conditioning circuitry used in receiving the wavelength band depends on the form of the input signals, 10 and 11, from the respective detector. Similarly, the differencing and normalizing of signals 10 and 11, discussed below, are performed by a suitable analog or digital processor. This includes analog multipliers, analog-to-digital converters, pre-amplifiers and amplifiers, microcontrollers, microprocessors, field programmable gate arrays (FPGA), application specific integrated circuits (ASIC), and other general-purpose computational devices.

By detecting and conditioning the two signals, it is possible to calculate a difference between these two signals, which will alternate in polarity as wavelength is swept as shown in FIG. 1. Preferably, the etalon signal 10 is normalized to the reference signal 11 if the optical output intensity is also a function of wavelength. The reason for performing the normalizing process is as follows. As the laser is heated or cooled to change its wavelength, the output intensity of the laser also varies (e.g., heating causes a reduction in output power). With the etalon response curve being a function of both optical power and wavelength, this change in optical power could be interpreted as a change in wavelength even though it is not an actual change in wavelength. To eliminate this, the etalon signal is normalized by taking the difference between the etalon signal and the reference signal and then dividing the result by the reference signal. This means that any changes in optical power will be eliminated, since the reference signal is only sensitive to changes in optical power, not to changes in wavelength. Thus, using either of the equations (etalon−reference) reference÷reference or (reference−etalon)÷reference, (depending upon which slope the wavelength is on) results in a difference signal that is a function of the wavelength only and not the optical power.

This normalized difference signal is then used as a control signal to drive a thermoelectric (TEC) cooler or heater or both, in order to vary the temperature of the laser and thus vary its wavelength.

One of ordinary skill recognizes that the specific output circuitry depends on the form of the output device, e.g. a TEC. This includes analog circuitry, digital-to-analog converters, pre-amplifiers and power amplifiers, and other general-purpose current and voltage output stages. In any given instance the control signal will tend to drive the laser temperature, and thus the wavelength of the laser, from an arbitrary starting position 18 towards one of the immediately adjacent "zero crossings" or grid channels 12 and 14. The polarity of the control signal is suitably chosen to regulate the laser's wavelength by heating or cooling the laser, as necessary, to hold the wavelength to a desired channel. Which of these alternate crossings the system will tend toward is solely dependent upon how the difference signal is calculated.

Following a convention that heating the laser red-shifts the wavelength to a longer wavelength value and that cooling the laser has the opposite effect (i.e., of a blue shift), an etalon-reference difference signal (etalon minus reference) will tend to drive the wavelength to crossings located on negative slopes (grid channel 12). By contrast, a reference-etalon difference signal (reference minus etalon) will drive the system towards zero-crossings on positive slopes (grid channel 14). Upon these points the wavelength of the laser will be stabilized by the control system in a closed loop servo. It is these crossing points that are considered the DWDM channels of the laser. The temperature control signal oscillates above and below the zero crossing points, i.e. 12 and 14, as the control system servos the control signal to maintain a difference near zero.

Figure 2:
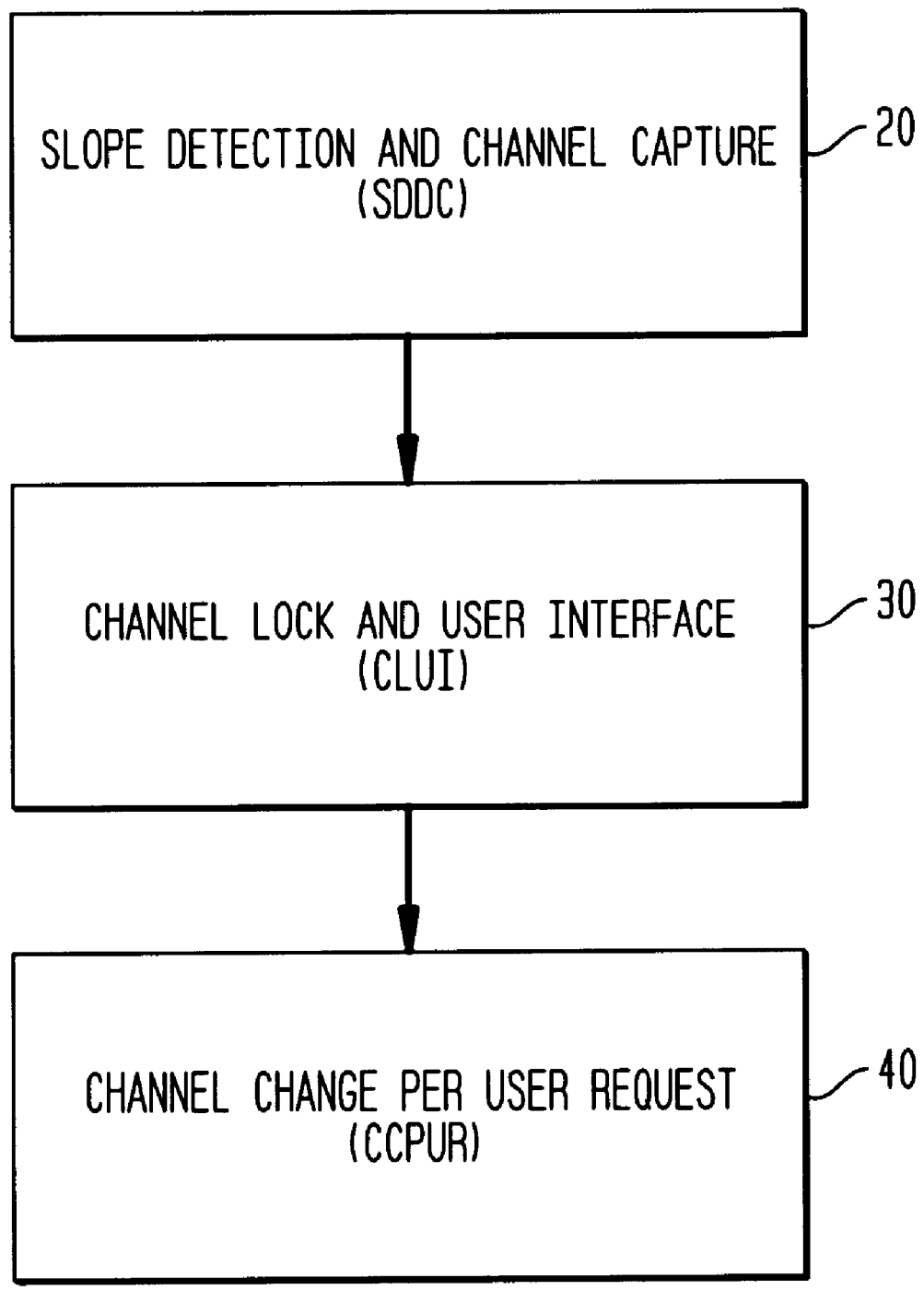
FIG. 2 is a flow diagram of a first exemplary embodiment of the invention.

FIG. 2 is a flow diagram illustrating the three basic elements of the present invention: Slope Detection and Channel Capture (SDDC) (block 20); Channel Lock and User Interface (CLUI) (block 30); and Channel Change Per User Request (CCPUR) (block 40). These elements are described in detail in FIGS. 3, 4, and 5.

Figure 3:
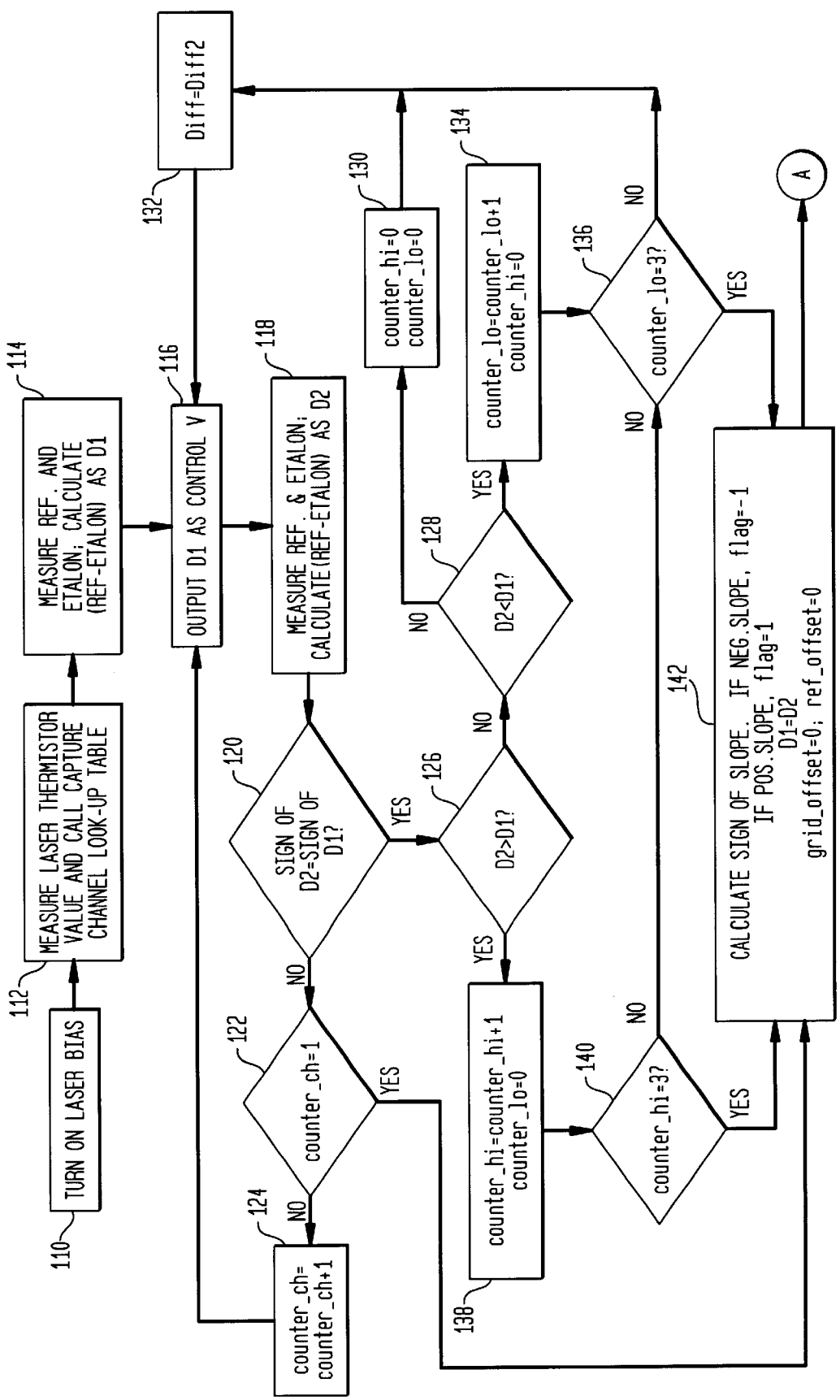
FIG. 3 is a flow diagram of the Slope Detection and Channel Capture sub-system of the invention.

Referring to FIG. 3, in SDDC block 20, at laser start-up (block 110), the laser temperature is read from a thermistor or other suitably accurate temperature-sensing device. A predetermined look-up table, based on this temperature, is accessed to determine what channel region the laser wavelength (block 112) is starting in (18, FIG. 1).

Alternatively, at block 112 a strong drive is applied to the TEC to force the laser to heat/cool (depending on the polarity of the drive which may also be a result of the look-up table) which in turn starts the laser wavelength to translate across the etalon function. The normal turn-on temperature transients resulting from applying a bias current to the laser are typically sufficient to start the drive towards a crossing point (i.e. grid channels 12 or 14 of FIG. 1). From this wavelength translation and subsequent progression along the etalon function, the local slope of the etalon (i.e., the slope of the etalon signal near a particular grid channel) may be determined as described below. Note that the starting temperature allows one to know where in wavelength space one is at start-up (i.e. based on a prior calibration to an absolute instrument). At block 114 the reference and etalon values are measured and a first difference signal (reference minus etalon) is calculated and output as a first difference D1. The output difference D1 is input to block 116 that signal-conditions the output signal by applying suitable gain (proportional) and time constants (integral, derivative) to the output signal and applies this signal to the TEC circuitry.

In block 118 the reference and etalon values are again measured and a second difference (reference minus etalon) is calculated and output as a second difference D2. At block 120 the signs of difference D2 and difference D1 are compared. If the signs are not the same, the system sequence moves to block 122 and 124 where a stored value of a counter is read and then the stored value is incremented. This allows the system to repeat the sequence of 116, 118, and 120 at least one more time, thus allowing a delay. This delay allows the TEC enough time to overcome the thermal mass of the system so the laser can be temperature tuned, and in the case of being exactly on an etalon peak, tuned beyond a sign change at one peak. The slope of an etalon peak is extremely steep (i.e., it is too sharp) and is thus too sensitive to be used as a control point. Likewise, at the other extreme (at an etalon "valley"), the slope is too flat to be used as a control point.

If the signs of D1 and D2 are equal, indicating that the temperature and/or wavelength has stabilized on the same slope of the etalon and not within a slope transition, at block 120 control is passed to block 126. It is determined in block 126 if D2 is greater than D1. If D2 is greater than D1 (indicating stabilization on the same negative slope), then at block 138 a counter is incremented and tested to repeat the output value (116), test sign (118–126), and count (138) steps three times to time average any noise that may be present on the difference signal. Noise may be present due to electrical noise or due to structure on the etalon response function. Blocks 128 and 134 operate similarly to blocks 126 and 138 except for different polarities of the difference signals. For example, if D2 is not greater than D1 at block 126, then at block 128 it is determined if D2 is less than D1 (which indicates stabilization on the same positive slope). If D2 is not less than D1, this means that D1 and D2 are equal (indicating a problem with the reading, such as noise, capturing of the new readings too fast for the laser wavelength to move any significant amount, or movement of the signal over an etalon peak); thus, at block 130 the two loop counters corresponding to the positive (counter_hi) and negative (counter_lo) slopes of the etalon response verses wavelength are zeroed. This causes the SDDC loop to be repeated three more times until accurate readings are obtained.

In each of these three passes through sequence 118, 120, 126 (128), 138 (134), and 140 (136) the last value for D1 (the current control voltage) is replaced by D2 (a new control voltage calculated in response to how the etalon/laser responded to the control signal D1) as shown in block 132. The new control voltage D2 should always drive the wavelength of the laser closer to its desired position. If the "current" control voltage D1 is not replaced with the new control voltage D2 prior to outputting D1 as the control signal again, the control signal would keep getting larger and larger because the difference between the etalon value and the reference value, which should be getting smaller, would be ignored. This is because the original control voltage D1 calculated at start-up would continue to be used. By replacing D1 with D2 after each iteration, the change in value of the control voltage is slowed as it gets closer to the desired channel, instead of being driven harder and harder as it approaches the channel point.

This operation adjusts the rate of the change of the control signal amplitude as it approaches the desired control point (12, 14, FIG. 1). The use of three passes is given for purpose of example; the actual number of passes can be adjusted higher or lower depending on the transfer characteristics of the particular implementation of this invention. For example, if it takes longer for heat transfer to occur in a particular laser package (i.e., it takes longer to reach operating temperature), the number of loops or passes can be increased to accommodate for the longer time period. If such flexibility were not available, a sensing of "no change" with respect to temperature could be perceived as an indication that an etalon peak had been reached, when in reality the system had not had adequate time to heat up to a point where heat passed through the laser package to start moving the wavelength.

If a positive slope is determined at block 142 a direction flag is set to +1. A negative slope causes that flag to be assigned to −1. This flag is used as a sign multiplier in the steps described in FIG. 4. The steps in FIG. 3 drive the wavelength toward the closest channel to the laser's start-up wavelength (based on the initial laser temperature). When the process is complete, the wavelength is captured at the channel closest to the laser's start-up wavelength.

Figure 4:
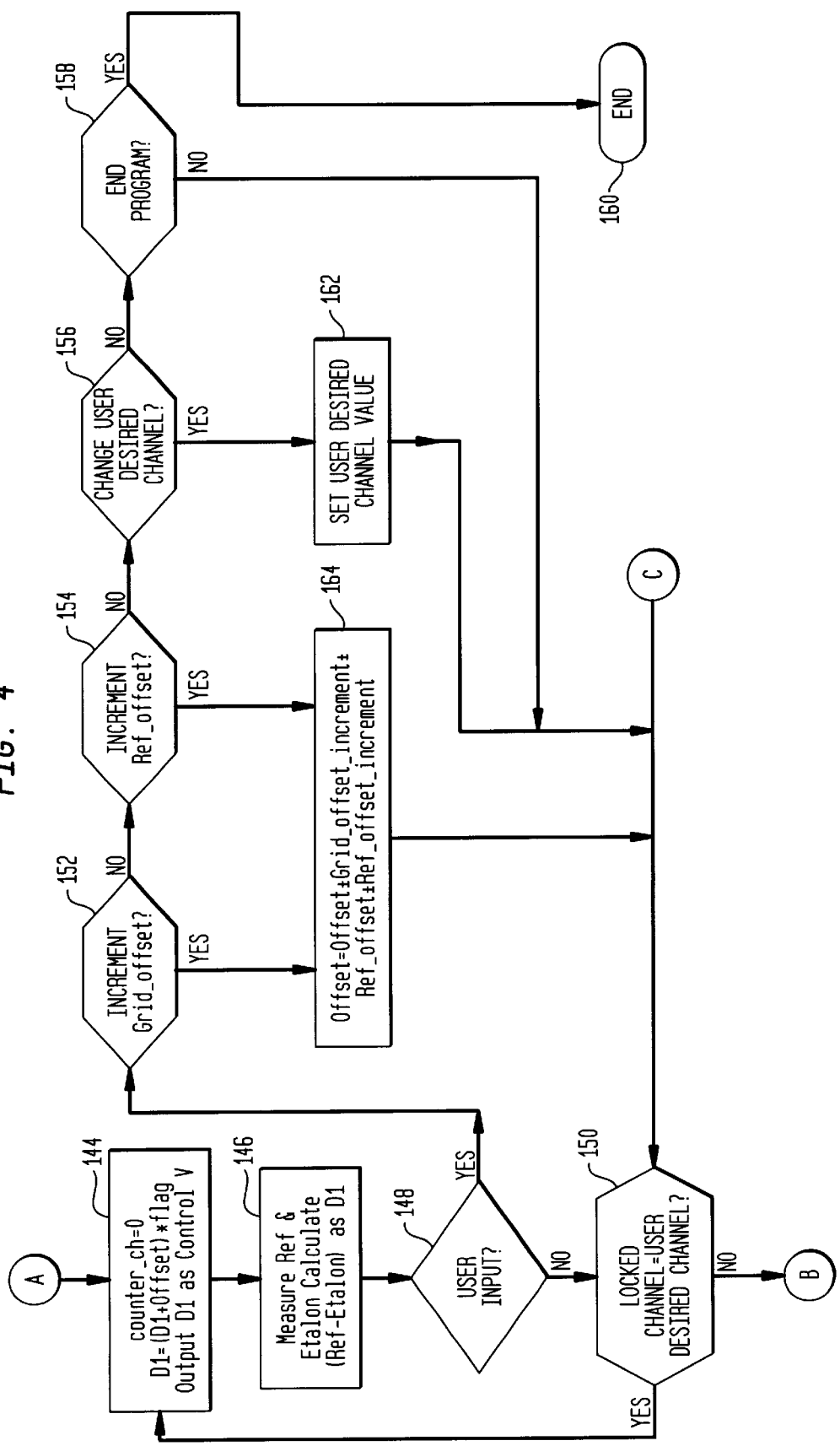
FIG.4 is a flow diagram of the Channel Lock and User Interface sub-system of the invention.

Referring now to FIG. 4, the steps described below with respect to CLUI block 30 continuously execute to create a feedback loop that maintains a lock on the selected channel by adjusting the drive of the TEC. This locking loop continues to maintain the control point until a user input request is detected. A user can input information to offset the entire grid position, offset the reference level to alter channel spacing, change channels, or exit the program. The locking loop will be interrupted only if one of these user events are detected.

In operation, the CLUI block 30 operates as follows: block 144 receives the output value D1 and a flag indicating the sign of the slope determined in SDDC block 20. "Offset" in FIG. 4 is comprised of a "Grid_Offset" value and a "Ref_Offset" value. Grid_Offset refers to a numerical offset that effectively moves the absolute position of the peaks of the etalon's FSR. Ref_Offset refers to a numerical offset to raise or lower the position at which the reference photodetector's signal crosses the etalon photodetector's signal. Ref_Offset allows the grid channels to be relatively positioned, in wavelength, once the absolute position of the grid spacing is established. Together, these two offset values comprise the "Offset" value seen in block 144, which is added to the control value D1. Block 144 then outputs a control value (D1+Offset) to the TEC drive circuitry. Block 146 once more measures the etalon and reference signals after the new control value (D1+Offset) has been applied to the TEC circuitry, and calculates a new control value (D1). At block 148 it is determined if user input is desired. If no user intervention is necessary control passes to block 150. Block 150 compares the current channel number to that of the desired channel. The default user desired channel is established by the start-up code of this method or from a look-up table value.

The loop consisting of blocks 144, 146, 148, and 150 repeats indefinitely as the main control loop unless user intervention (a keystroke, or other type of interrupt signal) is desired.

If user intervention is initiated at block 148, the remainder of the CLUI blocks are executed. At block 152, it is determined if the user wants to offset the wavelength grid. At block 154, a similar determination is made to see if the user 415 wants a reference level adjustment. Block 164 computes the vector sum of the two offsets for a combined grid and reference offset value. This combined offset effects the absolute wavelength position relative to the ITU channel grid. Offset is comprised of the vector sum of the Grid_Offset and the Ref_Offset values along with Grid_offset_increment and Ref_offset_increment. Grid_offset_increment and Ref_offset_increment are the numerical offsets added or subtracted to Grid_Offset and Ref_Offset, respectively. These offsets are calibrated to allow the system to move from channel to channel and is typically scaled to allow integer channel number changes. Grid_offset_increment and Ref_offset_increment are numerical offset values used as a manufacturing tool to finely calibrate the system by adding or subtracting their values to Grid_Offset and Ref_Offset, respectively. In doing so, the crossings of the etalon and reference response curves can be made to appear to fall precisely on the ITU channel grid without requiring precise mechanical tolerances within the laser package, and thus, provide for manufacturing tolerance relief for the etalon piece part.

The values for the Grid_offset_increment and Ref_offset_increment are input at the user interface or are taken from a look-up table. These increments, explained in more detail below are, typically, fixed values that are either added or subtracted from the last value, and whose purpose is to effect a wavelength step (a change from one channel to another as opposed to changes for the purpose of stabilizing on a particular channel). Block 156 tests for a request to change whole channels (i.e., to completely change channels as opposed to fine-tuning between two channels). Block 162 sets the channel value to the desired (new) channel number. Control then passes to block 150 where the locked channel no longer equals the desired channel and control then passes to the CCPRU (block 40) where the change to the new channel is implemented. Blocks 158 and 160 of FIG. 4 allow the user to end the program and place the laser and control system in a safe idle state.

Figure 5:
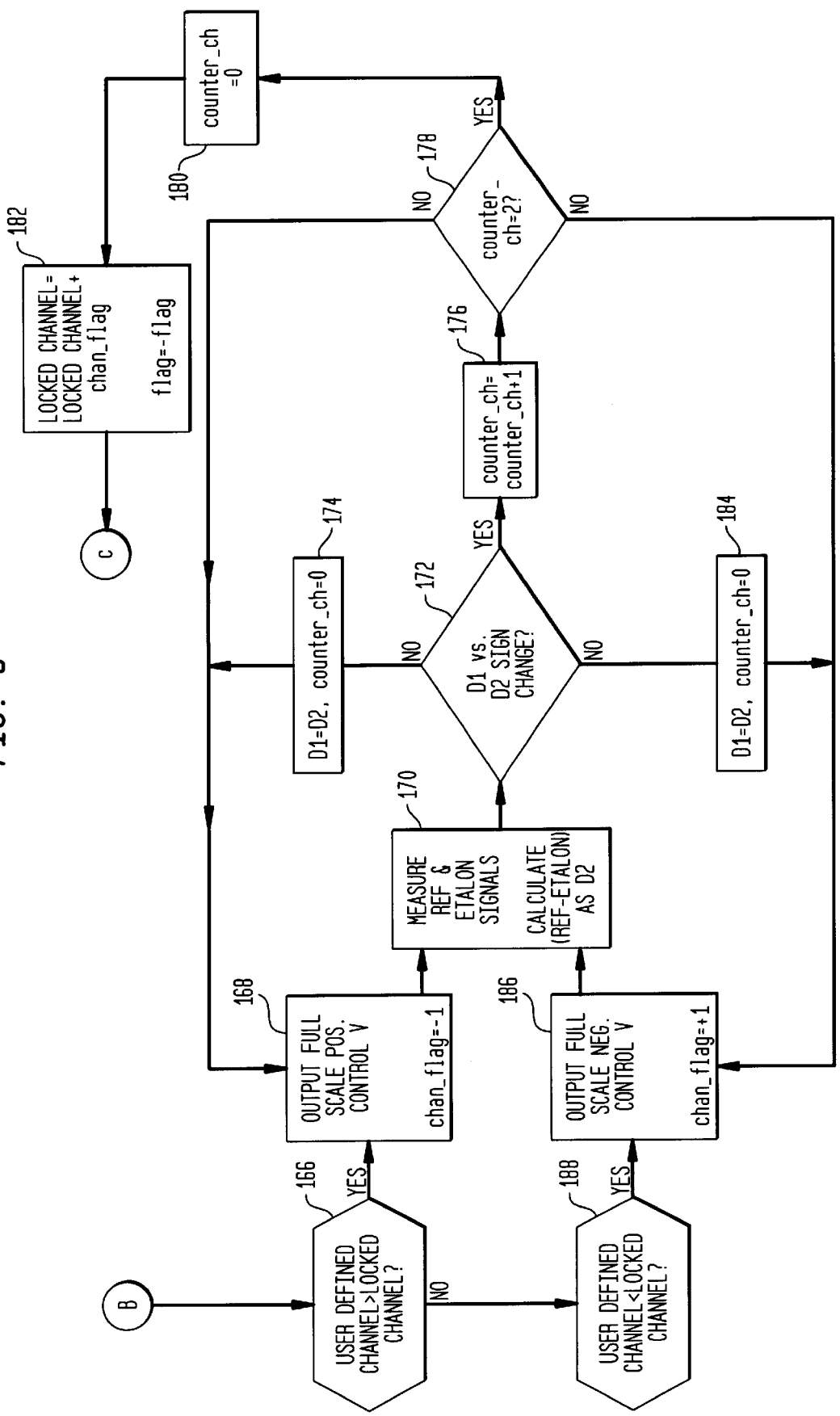
FIG. 5 is a flow diagram of the Channel Change Per User Request sub-system of the invention.

If channel change user input is sensed at CLUI block 30, the Channel Change Per User Request (CCPUR) block 40 is activated. In this block as shown in FIG. 5, the channel selected by the user is detected relative to the current channel, and then either a max or min drive signal is applied to the TEC to drive the laser temperature towards the new channel. The CCPUR block continually senses and counts wavelength channels, with the laser on, as the wavelength changes, until the desired user channel is obtained. Once the desired channel is obtained, the process loops back to CLUI block 30 and resumes a locking loop until the next User Input is detected. Referring to FIG. 5, in CCPUR block 40 it is first determined at block 166 if the user-defined channel from block 30 is greater than (by convention, a longer wavelength) the channel at which the laser is currently locked. If the user-defined channel is greater than the locked channel, the process proceeds to step 168 where full power is applied to the TEC (heat in this case). The use of full power is arbitrary with the desired response being to move to the next channel as quickly as the time constants of the system allow. Proportional-Integral-Derivative (PID) functionality may be applied for any change to the TEC output drive or succinctly in D1 and D2 changes. If at block 166 it is determined that the user defined channel is not greater than the locked channel, the process proceeds to block 188 where it is determined if the user defined channel is less than (a shorter wavelength) the locked channel. If the user-defined channel is less than the locked channel, the process continues with step 186 where negative control (cool) is applied to move the channel to the user user-defined location. The process steps for reaching the newly defined channel are identical to those described above with respect to blocks 168 or 186, 170, 172, and 174 or 184 with the exception that cooling is applied instead of heating. These loops transfer to block 176 when a sign change difference between D2 and D1 is sensed. This sign change indicates a channel region change as shown in FIG. 1. As the wavelength passes through grid channels (i.e. 12 to 14, FIG. 1) block 176 increments the channel counter for each sign change. Block 178 allows for a time delay in a manner similar to that of block 124 in FIG. 3. Once two same slope changes are determined, control passes to block 180 which re-sets the channel change counter. Block 182 adds or subtracts a channel from the currently locked channel number depending on the direction of the just-executed channel change. At block 182 the flag indicating the sign of the slope is set to indicate the current slope similarly to block 142 of FIG. 3. If a single channel change was requested, control continues at block 150 then to 144 (FIG. 4). If the user request demands more than one channel to be spanned, then control passes back to block 166 (FIG. 5). Blocks 166 to 150 are repeated until the desired channel is obtained. By counting the number of sign changes that occur as the wavelength moves, the number of channels moved can be determined (each change in sign indicates that a grid channel has been passed). After the desired number of channels are skipped by the CCPUR blocks, control passes to blocks 144, 146, 148, and 150 of FIG. 4, which repeat indefinitely as the main control loop unless user intervention is once again requested.

Figure 6:
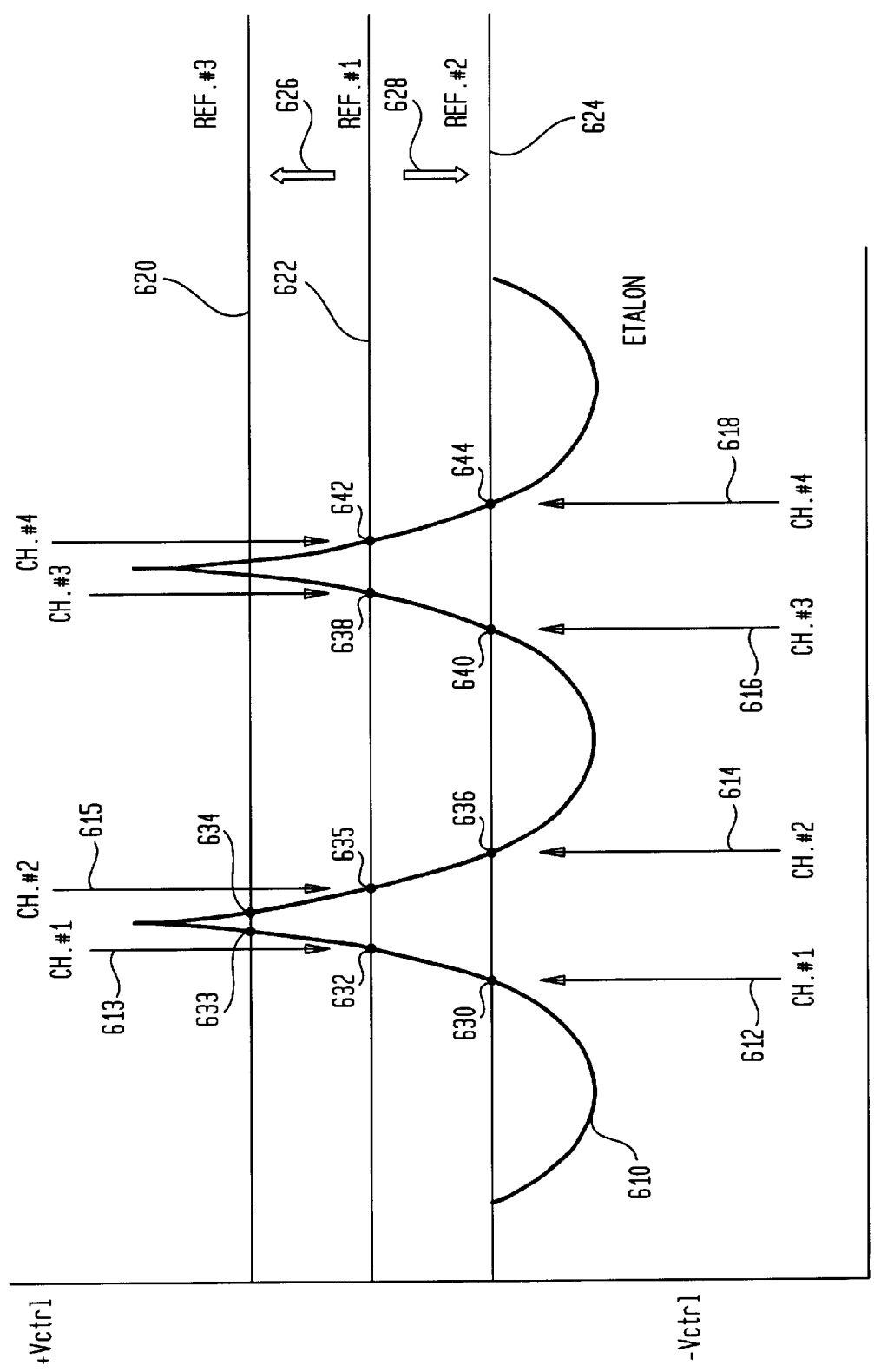
FIG. 6 is a sketch of channel locking points with numerically calculated reference levels in accordance with the present invention.

FIG. 6 illustrates channel locking points with numerically calculated reference levels in accordance with the present invention. By capturing the etalon and reference signals and then manipulating these signals through software, the value of the reference signal can be arbitrarily adjusted. This is significant in the sense that the etalon output is a non-symmetric periodic signal as a function of wavelength, and thus at all but a single reference signal value, the channel spacing upon capture and lock of the wavelength on both slopes will also be non-symmetric due to the locations of the zero crossings. This is evident in FIG. 6 by observing the channel spacing difference from 635 to 638 and from 632 to 635. These spacings are obviously not equal. Also shown in FIG. 6 are three different reference levels (620, 622, and 624) which produce six (630, 632, 633, 634, 635, and 636) different reference and etalon crossings. Obviously, there are an infinite number of channels available with varying reference levels. The ability to adjust the reference level to any desired value via addition or subtraction of a constant to its signal via software allows the channel spacing to be adjusted to be perfectly symmetrical on either slope of the etalon response. Software in the context of this invention is the algorithm, the high-level code, and the processor specific instructions necessary to implement this method for the specific form of hardware required to sense and control a tunable wavelength source. Any of a wide variety of channel grid spacings desired by the user can be obtained as shown in FIG. 6. For example, on the positive slope, etalon signal 610 and reference signal 622 cross at channel 1 (632) thereby defining a channel and its locking point. By subtracting position 628, numerically, from the reference signal a value that effectively moves the reference to position 624, a new channel 1 (630) is established. The new channel 630 has a shorter wavelength 612 than the wavelength 613 of the original channel. Similarly, adding position 626, numerically, to the reference signal moves the reference to a new position 620 where additional channels may be defined. For the negative slope, etalon signal 610 and reference signal 622 cross at channel 2 (635). By subtracting position 628, numerically, from the reference signal a value that effectively moves the reference to position 624, a new channel 2 (636), is established. The new channel 636 has a longer wavelength 614 than the wavelength 615 of the original channel 2. Reference numerals 616, 640, 638 and 642, 644, and 618 define channels 3 and 4 similarly. A look-up table or suitable algorithm can vary the channel-to-channel spacing adaptively as a system requires. This provides relief to manufacturing requirements and tolerances, as well as on the physical design constraints for the etalon piece part and its alignment to the laser.

FIG. 7 illustrates a basic structure for implementing the present invention. A laser module 710 includes a laser current supply 712 for supplying laser bias current to the laser 710. A thermistor 714 measures the laser temperature, and a TEC cooler 716 provides heating and/or cooling to the laser for driving the laser wavelength in one direction or the other. An optical splitter 718 divides the laser signal between the laser output 720 and a Fabret-Perot Etalon optical discriminator 722. The optical discriminator 722 splits the output from optical splitter 718 into a reference photo-diode output 724 and an etalon photo-diode output 726. The etalon photo-diode output 726 is the output from the optical splitter after it has been passed through an etalon. A bus 728 provides an interface between a software system 730. The software system 730 comprises a standard processor programmed to execute algorithms and/or programs which perform the steps and functions of the present invention. The software system 730 receives the etalon and reference photo-diode outputs and also temperature readings from thermistor 714. The software system 730 also provides control signals to TEC cooler 716 and laser current supply 712 to operate and control the laser in a known manner.

Since the control level can be altered to any desired value, full adjustment of the etalon grid is possible on an absolute basis relative to an actual wavelength of a laser. This means that if the etalon piece part is manufactured so that its periodic spacing does not fall precisely on, e.g., the ITU grid, numerical compensation is achieved by summing a numerically derived constant onto the control signal output. This effectively shifts the entire grid to a point where, when also adjusting the reference level numerically to a suitable value, the zero crossings will fall exactly on the ITU grid.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. A method of frequency-stabilizing a laser output on a desired channel, comprising the steps of:
   detecting a first optical signal from a laser passed through an etalon and outputting an etalon value;
   detecting a second optical signal from said laser, said second signal comprising a reference signal, and outputting a reference value;
   determining a normalized difference between said etalon value and said reference value and outputting a normalized difference signal based on said normalized difference, wherein said determining step comprises:
   calculating the difference between said etalon value and said reference value; and
   dividing the result of said calculation by said reference value; and
   controlling the laser output using said normalized difference signal.

2. A method as set forth in claim 1, wherein said controlling step comprises the steps of:
   applying a control program to said normalized difference to develop a control signal; and
   using said control signal to drive a laser output wavelength controller.

3. A method as set forth in claim 2, wherein said control program adjusts a rate of change of said control signal as the desired channel is approached.

4. A method as set forth in claim 3, wherein said adjustment of the rate of change of said control signal comprises the steps of:
   (a) determining a current normalized difference signal;
   (b) storing said current normalized difference signal as a control value D1;
   (c) applying said current normalized difference signal to said laser output wavelength controller to adjust the laser output;
   (d) determining a new normalized difference signal;
   (e) storing said new normalized difference signal as a control value D2;
   (f) applying said new normalized difference signal to said laser output wavelength controller to adjust the laser output;
   (g) comparing D1 and D2;
   (h) replacing said stored control value D1 with said new normalized difference signal; and
   (i) repeating steps (a) through (g) until the signs of D1 and D2 are the same.

5. A method as set forth in claim 4, wherein said laser output wavelength controller comprises a thermoelectric cooler (TEC).

6. A method as set forth in claim 4, wherein said laser output wavelength controller comprises a heater.

7. A method as set forth in claim 4, wherein said laser output wavelength controller comprises a cooler.

8. A method as set forth in claim 2, further comprising the step of sensing the wavelength of said laser at startup, wherein said control program comprises an algorithm which inverts the normalized difference calculation if said startup wavelength is not on said desired channel, whereby the channel of said laser is lockable at intervals which are approximately one half of the period of the etalon.

9. A method of frequency-stabilizing a laser output on a desired channel of a wavelength, comprising the steps of:
   determining the slope of the wavelength of the laser output when the laser is turned on;
   monitoring the laser output; and
   adjusting the laser wavelength if the monitored laser output does not coincide with the desired channel so that the laser output coincides with the desired channel, with the direction of adjustment being determined based on said slope.

10. A method as set forth in claim 9, wherein said slope-determining step comprises the steps of:
    (a) detecting a first optical signal from said laser passed through an etalon and outputting an etalon value;

(b) detecting a second optical signal from said laser, said second signal comprising a reference signal, and outputting a reference value;

(c) determining a normalized difference between said etalon value and said reference value and outputting a current normalized difference signal D1 based on said normalized difference;

(d) repeating steps (a) through (c) and outputting a new normalized difference signal D2; and (e) comparing D1 and D2 to determine the sign of the slope of said wavelength.

11. A method as set forth in claim 10, wherein said monitoring step comprises:

determining the current channel location of the laser output;

comparing the current laser output with the desired laser output;

outputting a first indication if said current laser output is the same as the desired laser output; and outputting a second indication if said current laser output differs from said desired laser output.

12. A method as set forth in claim 10, wherein said adjusting step comprises;

receiving said second indication indicating that said current laser output differs from said desired laser output; and driving said laser output to said desired laser output.

13. A method as set forth in claim 12, wherein said driving step comprises applying positive control to said laser if said current laser output is less than said desired laser output and applying negative control to said laser if said current laser output is greater than said desired laser output.

14. A method as set forth in claim 13, wherein said positive and negative control comprises the heating or cooling, respectively, of said laser.

15. A method of frequency-stabilizing the frequencies of a Fabry-Perot etalon with a frequency separation of at least one-half the free spectral range of the etalon, comprising the steps of:

determining the slope of the wavelength of the laser output when the laser is turned on;

monitoring the laser output; and adjusting the laser wavelength if the monitored laser output does not coincide with the desired channel so that the laser output coincides with the desired channel, with the direction of adjustment being determined based on said slope.

16. A method as set forth in claim 15, wherein said slope-determining step comprises the steps of:

(a) detecting a first optical signal from a laser passed through said etalon and outputting an etalon value;

(b) detecting a second optical signal from said laser, said second signal comprising a reference signal, and outputting a reference value;

(c) determining a normalized difference between said etalon value and said reference value and outputting a current normalized difference signal D1 based on said normalized difference;

(d) repeating steps (a) through (c) and outputting a new normalized difference signal D2; and (e) comparing D1 and D2 to determine the sign of the slope of said wavelength.

17. A method as set forth in claim 16, wherein said adjusting step comprises the steps of:

applying a control program to said normalized difference to develop a control signal; and using said control signal to drive a laser output wavelength controller.

18. A method as set forth in claim 17, wherein said laser output wavelength controller comprises a thermoelectric cooler (TEC).

19. A method as set forth in claim 17, wherein said laser output wavelength controller comprises a heater.

20. A method as set forth in claim 17, wherein said laser output wavelength controller comprises a cooler.

21. A method as set forth in claim 17, further comprising the step of sensing the wavelength of said laser at startup, wherein said control program comprises an algorithm which drives the laser wavelength, via temperature, towards the desired channel and inverts the sign of the normalized difference calculation if said desired channel is located on a slope which is opposite in sign to that of the startup channel, whereby the channel of said laser is lockable at intervals which are approximately one half of the period of the etalon.

* * * * *